US007377736B1

(12) United States Patent
Fujii et al.

(10) Patent No.: US 7,377,736 B1
(45) Date of Patent: May 27, 2008

(54) CYLINDER, LOAD PORT USING IT, AND PRODUCTION SYSTEM

(75) Inventors: Atsuhiro Fujii, Kanagawa (JP); Norio Kajita, Aichi-ken (JP); Mitsuyasu Okabe, Tokyo (JP); Shoji Komatsu, Hiroshima-ken (JP)

(73) Assignees: CKD Corporation, Aichi-ken (JP); Rorze Corporation, Hiroshima-ken (JP)

( * ) Notice: Subject to any disclaimer, the term of this patent is extended or adjusted under 35 U.S.C. 154(b) by 624 days.

(21) Appl. No.: 09/561,634

(22) Filed: May 2, 2000

(30) Foreign Application Priority Data

Mar. 3, 2000 (JP) .............................. 2000-059654

(51) Int. Cl.
*H01L 21/677* (2006.01)
(52) U.S. Cl. ...................................... 414/217; 414/935
(58) Field of Classification Search ............. 414/217.1, 414/416, 217, 786, 939, 940, 937
See application file for complete search history.

(56) References Cited

U.S. PATENT DOCUMENTS

| 3,863,545 | A | * | 2/1975 | Kesti ............................... 91/45 |
| 4,116,113 | A | * | 9/1978 | Leclerc ............................ 92/24 |
| 4,524,676 | A | * | 6/1985 | Rogers ............................ 91/43 |
| 5,193,431 | A | * | 3/1993 | Propsting et al. ......... 92/21 MR |
| 5,275,540 | A | * | 1/1994 | Brown ......................... 417/404 |
| 5,365,828 | A | * | 11/1994 | Sperber et al. ................. 91/41 |
| 5,525,024 | A | * | 6/1996 | Freerks et al. .......... 414/416.01 |
| 5,915,562 | A | | 6/1999 | Nyseth et al. |
| 5,980,183 | A | | 11/1999 | Fosnight |
| 6,082,951 | A | * | 7/2000 | Nering et al. ............. 414/217.1 |
| 6,382,896 | B1 | * | 5/2002 | Hu et al. ..................... 414/217 |
| 2002/0015636 | A1 | * | 2/2002 | Lee et al. .................... 414/407 |

FOREIGN PATENT DOCUMENTS

| JP | 01-154306 U | 10/1989 |
| JP | 03-194201 | 8/1991 |
| JP | 4-88504 | 7/1992 |
| JP | 06-323305 A | 11/1994 |
| JP | 08-279546 A | 10/1996 |
| JP | 11-145245 A | 5/1999 |
| JP | 11-168137 A | 6/1999 |

* cited by examiner

*Primary Examiner*—Charles A Fox
(74) *Attorney, Agent, or Firm*—Baker & Daniels

(57) ABSTRACT

A cylinder which can precisely feed a piston rod 3 into three different positions. The cylinder includes a spring receiving member 14 which is placed coaxially with the piston rod in a piston room. Movement of the piston 4 is limited by one end of the piston room and a stopper 8 formed on the piston rod which prevents the piston from moving in the opposite direction. A first spring member 15 is disposed in the cylinder tube 2 to separate the spring receiving member from the piston. A hollow 9 is formed on the periphery of the piston rod at a further position from the piston than the stopper and a stop pin 11 in the cylinder tube 2 which is biased in the direction of the hollow by a second spring member 12 engages with the hollow. A load port utilizes the cylinder for a production system.

22 Claims, 13 Drawing Sheets (A)

(B)

(A)

(B)

(A)

(B)

(C)

(D)

(A)

(B)

(C)

(A)

(B)

(C)

CYLINDER, LOAD PORT USING IT, AND PRODUCTION SYSTEM

BACKGROUND OF INVENTION

1. Field of the Invention

This invention relates to a cylinder, a load port using it and a production system using the load port, and in particular, to a load port which complies with the SEMI standard and copes with FOUPs (Front Opening Unified Pods) having a variety of latchkey receptacle shapes.

2. Description of the Related Art

Until now, open cassettes have been mainly used as a container which stores a plurality of semiconductor wafers. However, in order to reduce the production cost of high-characteristic semiconductor devices, the mini-environment systems have been advocated, which reduce the cost related to a clean room. In the mini-environment systems, the SMIF (Standard Mechanical Interface) system is widely used for 200 mm-wafers, and the FOUP (Front Opening Unified Pod) system is being examined to be used for 300 mm-wafers.

The FOUP system was advocated and provisionally standardized at SEMI (Semiconductor Equipment and Materials International) composed of semiconductor manufacturing equipment manufacturers and material manufacturers all over the world. Semiconductor device manufacturers are also preparing to construct the mass-production line with this system. The FOUP system was technically examined at the standard committee of SEMI and was provisionally standardized. Here, the SEMI standard E57-0299 strictly defines the accuracy of the load port mechanical interface method to open and close an FOUP door; on the other hand, it allows FOUP manufacturers more latitude in adopting mechanical interface of FOUP.

The FOUP system, for example, is described in detail in JP8-279546A. The structure and the opening and closing mechanism of FOUP are explained by referring to FIGS. 5 and 6. FIG. 5 is a perspective view of a load port carrying out the opening and closing of FOUP door. Here, load port 30 is composed of frame 31 having a opening, stage 32 which is enable to move in the frame direction and has three kinematic pins 34 on the surface, and port door 33 which is inserted into the opening from opposite direction to stage 32 and retreated from the opening. In port door 33, two registration pins 36 are mounted diagonally, and two latchkeys 35 that rotate between the vertical position (90-degree position) and the horizontal position (0-degree position) are installed. Additionally, holding pads 37 are installed surrounding respective registration pins 36 to fix FOUP door 52 to port door 33.

FOUP 50 is composed of FOUP box 51 and FOUP door 52, as is shown in FIG. 6. FOUP box 51 has a plurality of shelves to hold wafers 53 and handles 56 for carrying by hand. In FOUP door 52, latch holes 55 and registration holes 54 are formed at corresponding positions to latchkeys 35 and registration pins 36 of port door 33. Inside latch holes 55, a latchkey receptacle is installed to engage with latchkey 35. The locking and unlocking operation of latches 56 is carried out by turning the latchkey receptacles using the latchkeys.

It is stipulated in the SEMI standard that fixing and unfixing of FOUP door 52 to and from FOUP box 51 is made by turning the latchkey receptacles to the positions of the 90-degree and the 0-degree, respectively. However, there is no concrete stipulation on the fixing method of FOUP door, and therefore, FOUP manufacturers are allowed to adopt their own method. The opening and closing mechanism of Foup door is described in, for example, U.S. Pat. No. 5,915,562.

The opening and closing operation of FOUP will be explained below. An FOUP is placed on stage 32 having three kinematic pins 34 mounted thereon and is aligned with the aid of the kinematic pins. Then, stage 32 is moved forwards to insert registration pins 36 of the port door into registration holes 55 of FOUP 50, whereby the FOUP door is positioned against the port door. Further advance of the stage makes latchkeys 35 of the port door engage with latchkey receptacles through latch holes 55 of FOUP, and the FOUP door finally contacts with the port door. At this stage, the inside of holding pads 37 installed around the root of registration pins 36 are evacuated to fix the FOUP door to the port door.

Then, the FOUP door is detached from the FOUP box by turning latchkeys 90 degrees to the 0-degree position. The port door, holding the FOUP door, is moved backwards and then downwards. Thus, wafers can be taken out through the opening. Each wafer stored in the FOUP box is transferred by e.g. a scalar type robot disclosed in JP No. 2749314 to a wafer processing tool.

When the FOUP door is closed, the same operation is made in reverse order.

This FOUP system was established as a provisional specification of SEMI in 1996, and each company has developed and manufactured FOUPs and load ports on the basis of this standard. Various disadvantages about the FOUP system have been clarified with advancing the verification of operation.

As mentioned above, there is few stipulation on FOUP, in spite of strict stipulation on the load port: for example, the shape and size of latchkey are defined including their tolerance, but those of latchkey receptacle are not. Therefore, the following problems have arisen. According to the SEMI standard E62-0999, the tolerance on the rotation angle of latchkey is defined as ±1 degree at the 0-degree position and 90-degree position. However, since there is no stipulation on the size of the latchkey receptacle, latchkey receptacles may not rotate 90 degrees even if latchkeys rotate by 90 degrees, as shown in FIG. 13, in the case where the width W1 of latchkey receptacles 57 is to some extent larger than the width W2 of latchkey 35. That is, latchkey receptacles may not rotate to the 90-degree position, but to the (90-θ) degree position depending on the difference of (W1-W2), which results in failing to lock the latches. Even when the latches are locked, if the FOUP of which latch receptacles do not stay at the 90-degree position is transported to the load port of next process tool and the stage thereof is moved forwards to open the FOUP, latchkeys may contact or collide with latchkey receptacles of the FOUP. The contact or collision makes dust, and contaminates the wafer transferring space. Furthermore, the repetition of the contact and collision may deform the latchkey receptacles, resulting in that latchkey receptacles cannot rotate to the 0-degree position, even when latchkeys rotate to the 0-degree position. Thus, latchkeys will stop at e.g. 5 degrees that is out of tolerance range of ±1 degree, which means that the FOUP door can not be detached from FOUP box. This becomes severe disadvantage in the manufacturing process.

Although each FOUP manufacturer has carried out various examinations in order to solve the above problems, the appropriate solution has not been obtained from the viewpoint of cost and reliability.

SUMMARY OF THE INVENTION

The principal object of this invention is to overcome the disadvantages of prior art mentioned above, and to provide a load port which perform secure and reliable latch operation during the FOUP opening and closing process. The further object of this invention is to provide a cylinder suitably used for the load port. Another object of this invention is to provide a production system which makes possible mass-production with high reliability of semiconductor integrated circuits and the like.

In order to solve the above-mentioned problems, the inventors examined the insertion method of a latchkey to a latchkey receptacle and the latching mechanism in detail by using a cylinder as a driver of latchkey. It has been concluded as a result of these examinations that the latching method by which latchkey receptacles are corrected to the 90-degree position after latches are locked is most reliable and secure to solve problems of prior art.

In other words, in order to set latchkey receptacles at 90-degree position in this method, latchkeys are turned beyond 90 degrees (i.e. to an angle of (90+θ) degrees) and thereafter returned to the 90-degree position.

This method requires a cylinder of which piston rod stops accurately at three different positions. Accordingly, the inventors constructed a tandem type cylinder shown in FIG. 12 by coupling a cylinders 72 for small angle (θ) rotation with a cylinder 71 for 90-degree rotation, and studied therewith the latching operation of FOUP having a variety of latchkey receptacle shapes. By controlling air pressure applied to a piston through four fluid ports of this tandem type cylinder, the piston rod could be accurately fed into three different positions as shown in FIG. 12 (A), (B) and (C). And it was proven that the problem of prior art could be solved.

However, it was also found that this type of cylinder became too large in size to install in the port door which complies with the SEMI standard. Therefore, the inventors further studied the cylinder structure which can be miniaturized based on these knowledges, and have finally accomplished cylinders of this invention.

A cylinder of this invention in which a piston rod performs reciprocating motion with the pressure of fluid applied to a piston through two fluid ports comprises: a spring receiving member placed coaxially with said piston rod in a piston room of a cylinder tube so that the movement of said spring receiving member is limited by one end of said piston room; a first spring member to separate said spring receiving member from said piston; a stopper formed on said piston rod to limit said spring receiving member from moving in the opposite direction to said piston; a hollow formed on the periphery of said piston rod at farther position from said piston than said stopper; and a stop pin installed in said cylinder tube to be pressed in the direction of said hollow by a second spring member to engage with said hollow, said piston rod able to be fed into at least three different positions.

The cylinder of this invention is further characterized in that said three positions of the piston rod are determined by the position where said piston comes in contact with the other end of said piston room, the position where said stop pin comes in contact with one end of said hollow, and the position where said spring receiving member is stopped from moving in the direction of said piston or said stop pin comes in contact with the other end of said hollow.

With such structures, the three poisons of the piston rod can precisely be determined and the transfer among these positions can also be carried out stably.

As compared with the tandem type cylinder, the number of component parts and accessories such as switching valve can be remarkably reduced, meaning that this invention has an advantage in cost reduction. As a result, it becomes possible to construct a compact, low-price, three-position type cylinder with high reliability in operation.

A load port of the present invention is composed of: a frame having an opening; a stage which holds a substrate container having a front door to seal inside airtight using a latch and moves in the direction of said frame; and a port door which is inserted into said opening from the opposite side to said stage to perform latching operation of said front door, and locks/unlocks said latch of said front door after said front door is fixed to said port door, wherein said port door comprising a latchkey by which said latch is locked and unlocked when said latchkey is turned to the vertical and horizontal positions, respectively, and a cylinder to turn said latchkey is constructed such that said latchkey is turned more than 90 degrees from the horizontal position and returned to the vertical position in locking operation of said latch.

That is, in order to lock the latch by the rotation of latchkey over 90 degrees, the FOUP door is surely fixed to the FOUP box and the sealing of the inside is secured for FOUPs having a variety of latch shapes. In addition, since latchkey receptacles always stay at the 90-degree position after latch is locked, the contact and collision between latchkey and latchkey receptacle can be avoided during unlocking operation at the load port of next process tool. As mentioned, reliable lock and unlock operation of the latch can be carried out stably using load port of this invention.

And the cylinder of the invention is preferably used for driving latchkeys. Furthermore, the load port is characterized in that said three positions of the piston rod are determined by the position where said piston comes in contact with the other end of said piston room, the position where said stop pin comes in contact with one end of said hollow, and the position where said spring receiving member is stopped from moving in the direction of said piston or said stop pin comes in contact with the other end of said hollow, and correspond to said horizontal position, said vertical position and said position of the latchkey angle which is larger than 90 degrees. This structure makes possible more reliable latching operation. Additionally, this structure is compact enough to be easily installed in the port door which meets the SEMI standard.

The load port of this invention is also characterized in that said latchkey is turned beyond said horizontal position when said latchkey is turned to unlock said latch. With this structure, unlocking operation of the latch becomes more reliable.

In addition, the load port is preferably constructed so that two latchkeys are connected and simultaneously turned by single cylinder, which can reduce the number of cylinders, valves and the like and therefore reduce the cost of load port.

And a production method of this invention is characterized in that the load port of this invention is used.

BRIEF DESCRIPTION OF THE DRAWINGS

FIG. 7 is a plan view showing the inside of a port door which a cylinder of this invention is installed in.

DETAILED DESCRIPTION OF THE PREFERRED EMBODIMENTS

The embodiments of this invention will be explained below using the figures.

(Cylinder)

Figure 1:
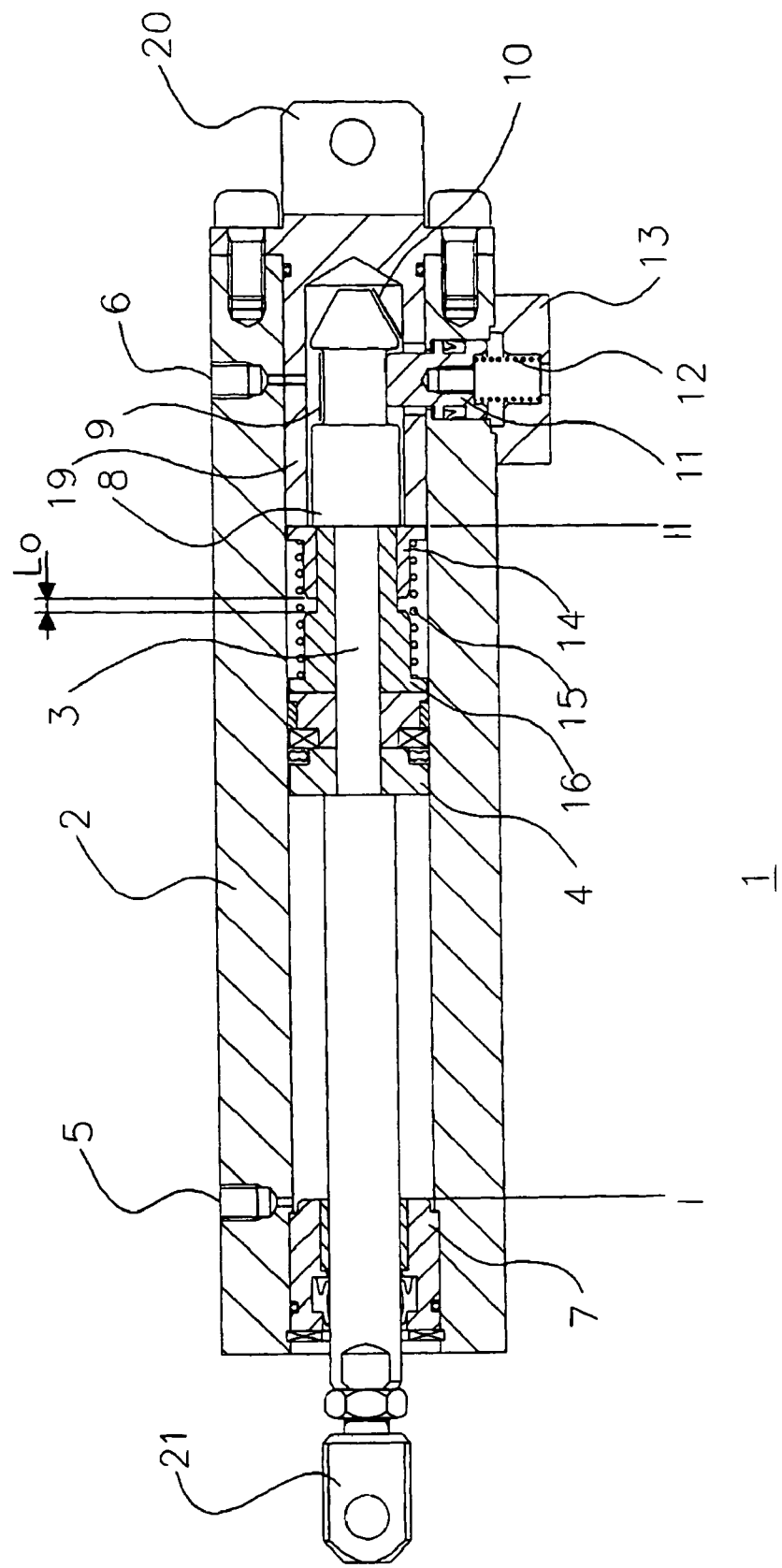
FIG. 1 is a sectional view showing the structure of a cylinder of the invention.

First, a cylinder of this invention is described by reference to FIGS. 1 and 2. FIG. 1 is a sectional view of a three-position feeding cylinder of this invention. In the figure, numeral 2 denotes a cylinder tube, 3 denotes a piston rod, 4 denotes a piston, and 5,6 denote a fluid port. Inside cylinder tube 2, piston chamber (I-II) with the inner diameter nearly equal to the outer diameter of piston 4 is formed between cylinder covers 7 and 19.

A sleeve 8 is fixed to one end portion of piston rod 3, which has a groove 9 (a hollow) on the periphery and a tapered portion 10 at the end. Between piston 4 and sleeve 8, a spring receiving member 14, which is made of a tubular member having a flange at one end, is placed coaxially with piston rod 3.

Spring receiving member 14 can move in the axial direction and move independently of piston rod 3. Between this spring receiving member 14 and piston 4, is placed a spring 15 (a first spring member) so as to push spring receiving member 14 into the right direction. Both cylinder cover 19 and sleeve 8 limit the rightward movement of spring receiving member 14. That is, sleeve 8 plays a role as a stopper which prevents spring receiving member 14 from moving into the right direction. In the case of FIG. 1, a spring guide member 16 which is placed to make spring 15 smoothly move along the axis is fixed to piston rod 3 and piston 4.

Furthermore, a stop pin 11 is installed in cylinder tube 2 to engage with hollow 9 formed in sleeve 8. This stop pin 11 is pressed by means of a spring 12 (a second spring members) and a cover 13 towards the central axis of piston rod 3. The axial movement of piston rod 3 is also limited by engaging stop pin 11 with hollow 9. This stop pin 11 is pushed back by compressed fluid introduced in fluid port 6, and is disengaged from hollow 9.

Next, the operation of the cylinder and the method for feeding out the piston rod into three different positions are explained by reference to FIG. 2. FIGS. 2 (A), (B), and (C) show three different states of piston rod 3 where feed distance increases in the order of (A), (B) and (C) (i.e. L3>L2>L1).

Figure 2:
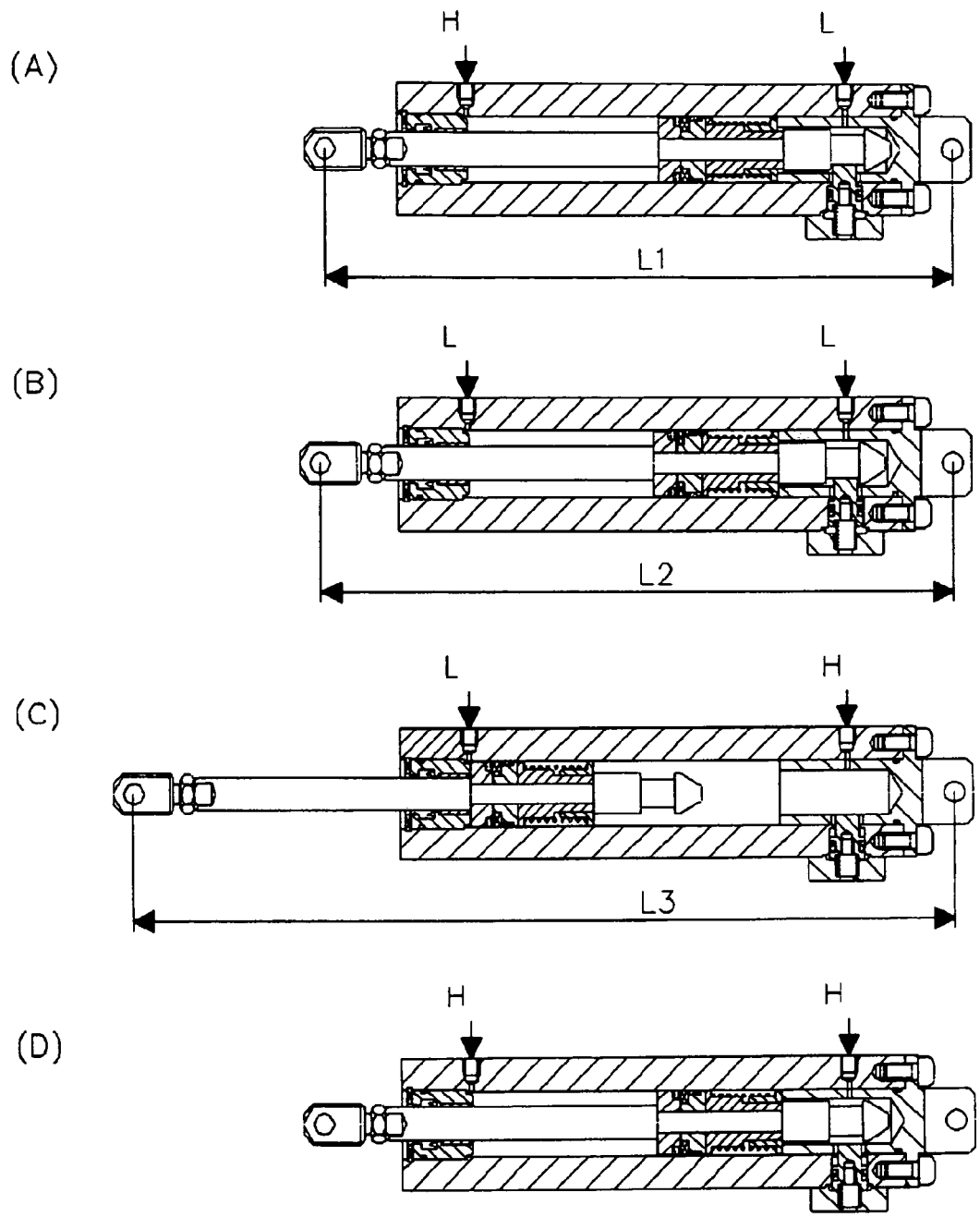
FIG. 2 is a sectional view explaining the operation principle of a cylinder.

First, fluid port 5 is switched to the high pressure (H), and then, fluid port 6 is switched to the low pressure (L), as is shown in FIG. 2 (A). As a result, piston rod 3 is pressed in the direction of the right side of the figure, and the feed distance becomes minimum L1. This position is that where spring receiving member 14 and spring guide member 16 come in contact with each other: in other words, the separation L0 between these members becomes zero. That is, the minimum value of the feed distance is determined by the position where spring receiving member 14 comes in contact with spring guide member 16. The minimum feed distance can be also determined by the position where stop pin 11 comes in contact with the left end of hollow 9 in stead of being determined by the position where separation L0 becomes zero.

Next, as shown in FIG. 2 (B), fluid port 5 is switched to the low pressure from the state of FIG. 2 (A). Thus, piston 4 is pressed by the force of spring 15 towards the left and piston rod 3 is moved leftwards until stop pin 11 comes in contact with the right end of hollow 9. This position corresponds to the second feed distance L2, which is determined by the position of the right end of hollow 9. Here, spring 15 should have sufficient force constant and length to be able to push piston rod 3 until stop pin 11 comes in contact with the right end of the hollow.

Finally, the maximum feed distance L3 is achieved by supplying the low and high pressure fluid to fluid ports 5 and 6, respectively, as shown in FIG. 2 (C). The pressure pushes piston 4 leftwards and send out piston rod 3. However, if fluid port 6 is switched to the high pressure from the state of FIG. 2 (B), piston rod 3 is pressed leftwards and stop pin 11 may not be disengaged from hollow 9 because of the friction between stop pin 11 and the end face of hollow 9. Therefore, it is preferable that the state of FIG. 2(C) is attained through i.e. the state FIG. 2 (D); that is, by switching firstly fluid port 5 and then fluid port 6 to the high pressure, stop pin 11 can be pushed back since stop pin 11 in not pressed to the right end of hollow 9. Thus, stop pin 11 can be securely disengaged from hollow 9. After that, fluid port 5 is switched to the low pressure, enabling piston rod 3 to move leftwards and stop at the position where piston 4 comes in contact with cylinder cover 7. This state is correspondent to the maximum feed position L3.

The transfer from the state (A) or (B) to (C), is carried out by applying the high and low pressure to fluid ports 5 and 6, respectively. Since the pressure of fluid port 6 is low, stop pin 11 is extruded by the force of spring 12 so that stop pin might block the piston rod from moving rightwards. However, tapered portion 10 formed around the tip of sleeve 8 will push stop pin 11 back to help the piston rod move smoothly. Thus, the reliable movement of piston rod 3 is ensured.

As mentioned above, by using the cylinder of FIG. 1 and selecting properly the position and length of hollow 9, the separation L0 between spring receiving member 14 and spring guide member 16, and cylinder cover 7, it becomes possible that three feed positions of piston rod 3 is determined precisely and arbitrarily.

Although the cylinder shown in FIG. 1 has the structure in which stop pin 11, hollow 9, spring receiving member 14 and so on are arranged in the opposite side of piston 4 to the feed direction of piston rod, it is also possible to construct a cylinder which has e.g. stop pin etc. in the same side.

Figure 3:
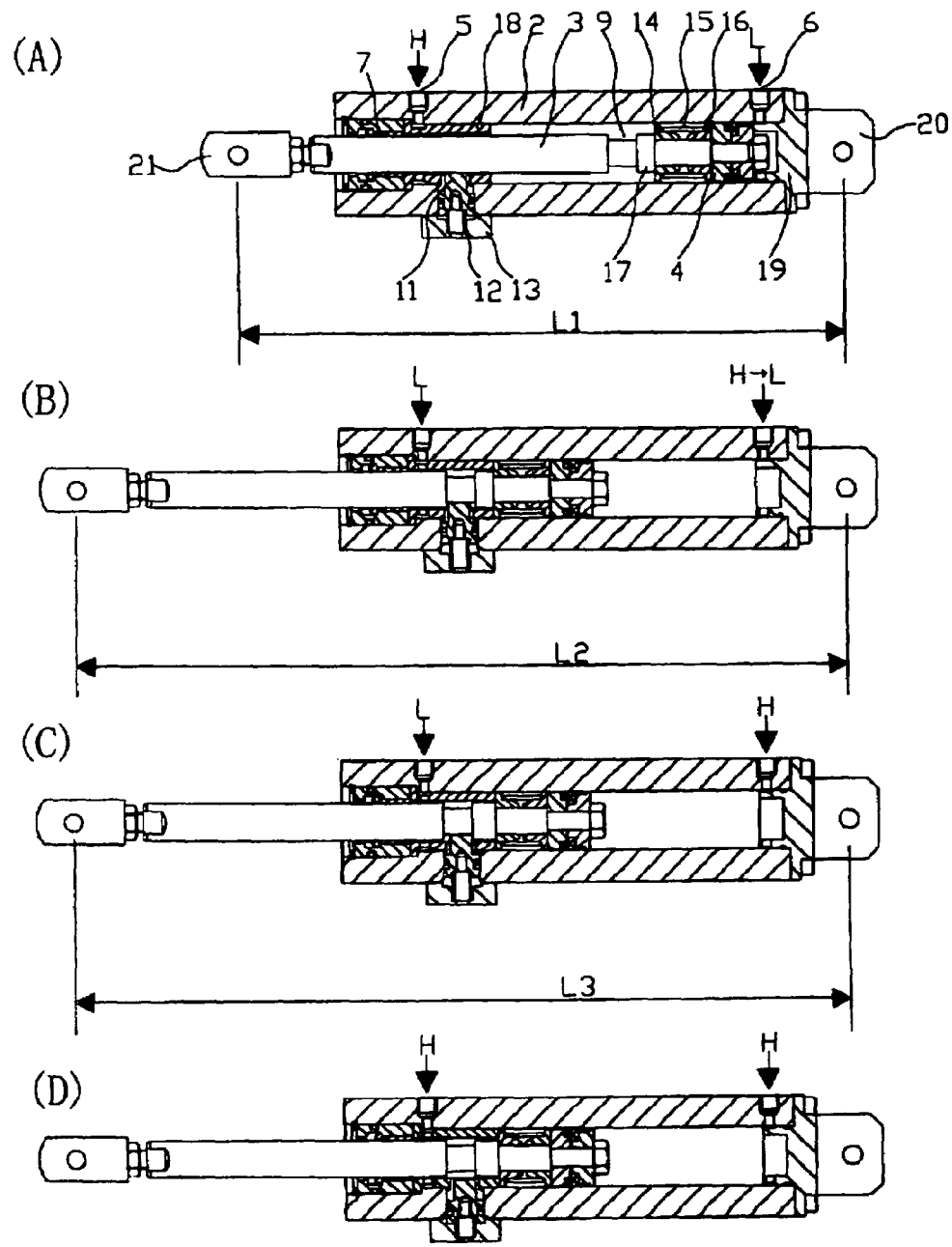
FIG. 3 is a sectional view showing another structure of a cylinder of the invention.

The cylinder of such structure is shown in FIG. 3. Sleeve 8 having a tapered portion shown in FIG. 1 is left out in the example of FIG. 3. Instead a part 17 of piston rod 3 works as a stopper which limits the leftward movement of spring receiving member 14 and a groove 9 (a hollow) is formed around the peripheral surface of piston rod 3. And spring guide member 16 is employed having the same shape as spring receiving member 14. Here, both members 14,16 of FIG. 3 can move axially and independently of piston rod 3 because neither of members are fixed to piston rod. In the cylinder of FIG. 3, three states shown in (A), (B) and (C) are correspondent to three feed positions of piston rod 3. The piston chamber is, in this case, a room surrounded by piston stop 18 and cylinder cover 19.

The minimum feed distance L1 is achieved by applying high and low pressure to fluid ports 5 and 6, respectively, as is shown in FIG. 3 (A). Piston rod 3 moves rightwards, and stops at the position where piston 4 comes in contact with cylinder cover 19. That is, the feed distance L1 is determined by the position of cylinder cover 19. In this state, stop pin 11 is being pushed back by piston rod 3.

The second feed distance L2 is achieved in the following way as shown in FIG. 3 (B). First, fluid port 5 is switched to the low and fluid port 6 to the high pressure to move piston rod leftwards. After stop pin 11 engages with hollow 9, fluid port 6 is switched to the low pressure; that is, both fluid ports are made at low pressure. When the pressure difference between both sides of piston 4 becomes zero, piston rod 3 moves rightwards by the force of spring 15 and stops at the position where stop pin 11 comes in contact with the left end of hollow 9. This state corresponds to the second feed distance L2, which is determined by the position where stop pin 11 comes in contact with the left end of hollow 9.

Next, fluid port 6 is switched to the high pressure at the state shown in FIG. 3(B). Piston rod 3 is pushed out until stop pin 11 comes in contact with the right end of hollow 9 (FIG. 3 (C)). That is, the maximum feed distance L3 is determined by the position where stop pin 11 comes in contact with the right end of hollow 9. Like the case of FIG. 1, the maximum feed distance can also be determined by the position where spring receiving member 14 meets spring guide member 16 (i.e. L0=0).

The transfer from the state of FIG. 3 (B) or 3(C) to the state of FIG. 3 (A) is made in the similar way described in FIG. 2. That is, fluid port 5 is made at the high pressure immediately after fluid port 6 is made at the high pressure, and then fluid port 6 is switched to the low pressure. Accordingly, stop pin 11 is easily pushed back, enabling smooth transfer to the state (A).

Figure 4:
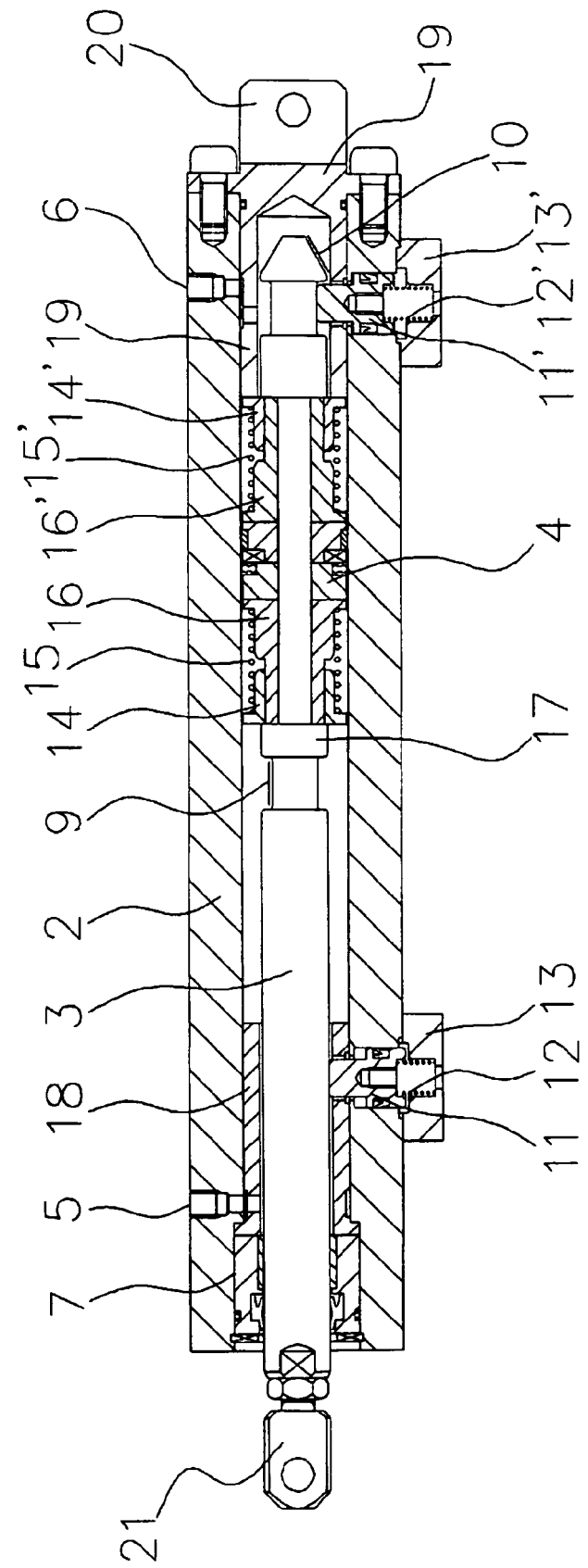
FIG. 4 is a sectional view showing another structure of a cylinder of the invention.

In addition, the cylinder of this invention can also have the structure as shown in, for example, FIG. 4, where hollows, springs, spring receiving members, stop pin etc. are placed at prescribed positions on both side of piston. This structure makes it possible to feed the piston rod into four or more positions.

Although cylinders have been discussed in detail with reference to FIGS. 1-4, it should be understood that the invention is not restricted to those embodiments. Various design changes, substitutes and modifications may be made thereto by those skilled in the art without departing from the spirit and scope of the invention. For example, hollow 9 formed on sleeve 8 or piston rod 3 is not necessarily formed all around periphery, but on the only part with which stop pin 11 engages. And spring guide member 16 can have any structure other than those shown in FIGS. 1 and 3 so long as the stable stretching of spring member is secured, irrespective of being fixed to piston. It is also possible to leave out spring guide member 16 in the invention. In this case, the separation L0 is defined as the distance between piston 4 and spring receiving member 14. The spring receiving member is not restricted to those shown in FIG. 14. In other words, there is no limit on the structure of spring receiving member 14 so long as it can be stopped by cylinder cover 19 (or, pistons stop 18) and stopper 17 such as sleeve 8. Moreover, the spring members of this invention can be of any structure and material, such as coil spring, plate spring, sponge, and rubber if spring receiving member 14 and stop pin 11 can be pressed thereby.

(Load Port)

Next, load ports using cylinders of this invention will be described below.

Figure 5:
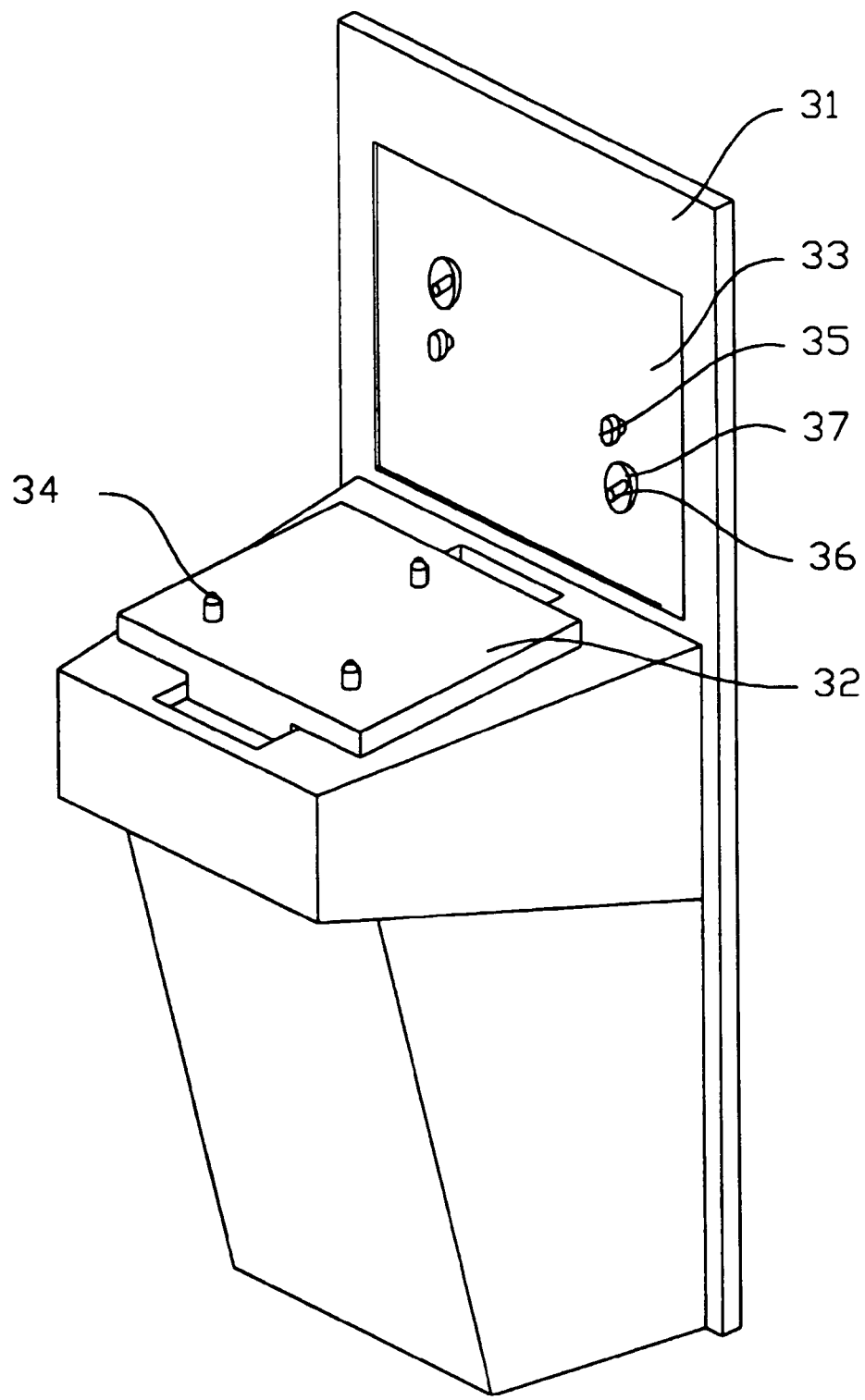
FIG. 5 is a perspective view showing the structure of a load port.
Figure 6:
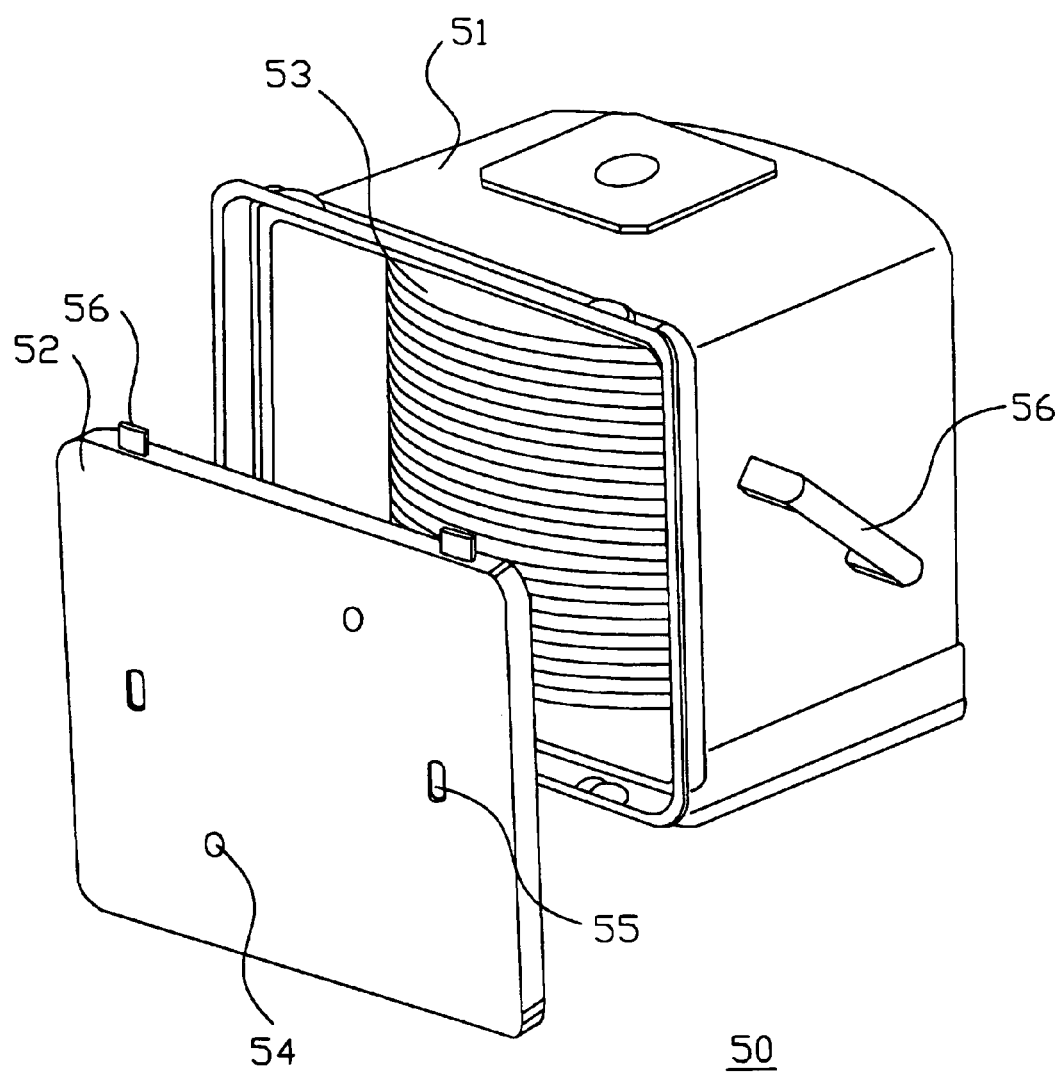
FIG. 6 is a perspective view showing the structure of an FOUR.

FIG. 5 is a perspective view which shows a structural example of a load port. A load port 30 shown in FIG. 5 is composed of a frames 31 with a opening therein for transferring substrates stored in FOUP, a stage 32 holding FOUP thereon and moving towards the frame, and a port door 33 which can be inserted into the opening and retracted backwards and then downwards from the opening when substrates in the FOUP are transferred. Three kinematic pins are mounted on stage 32 to align FOUP position. In the port door, two sets of latchkey 35 and cylinder 1 for driving the latchkey are installed to lock and unlock the latches of FOUP door 52. After the latches of FOUP door 52 are unlocked, port door 33 moves backwards and downwards together with FOUP door so as not to obstruct a substrate transfer robot from transferring substrates.

Figure 7:
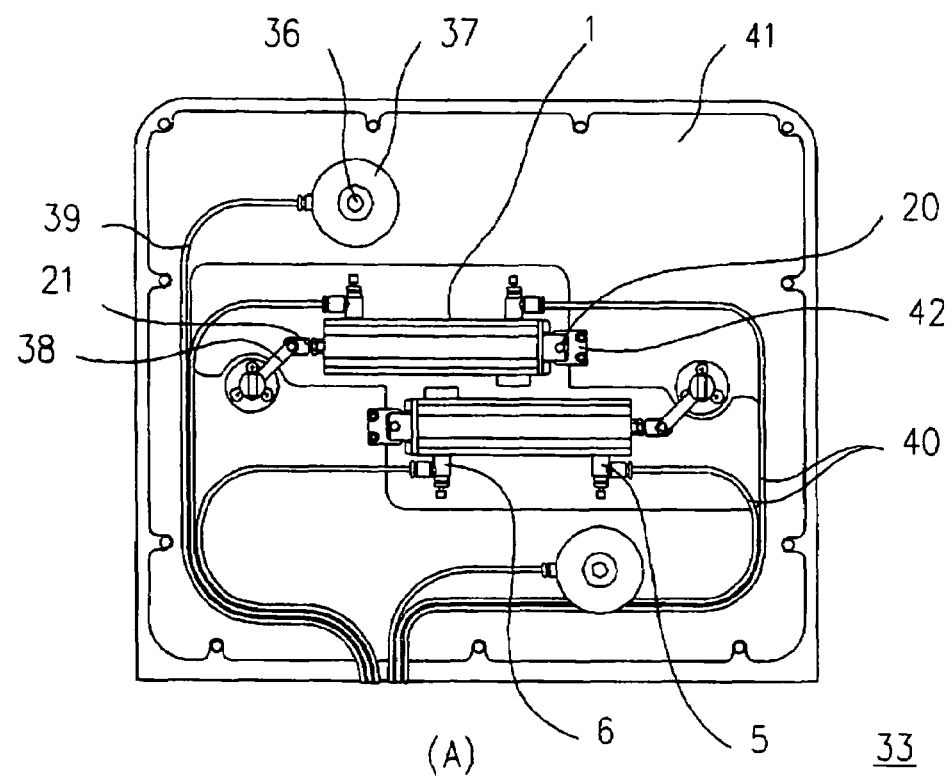
Figure 7:
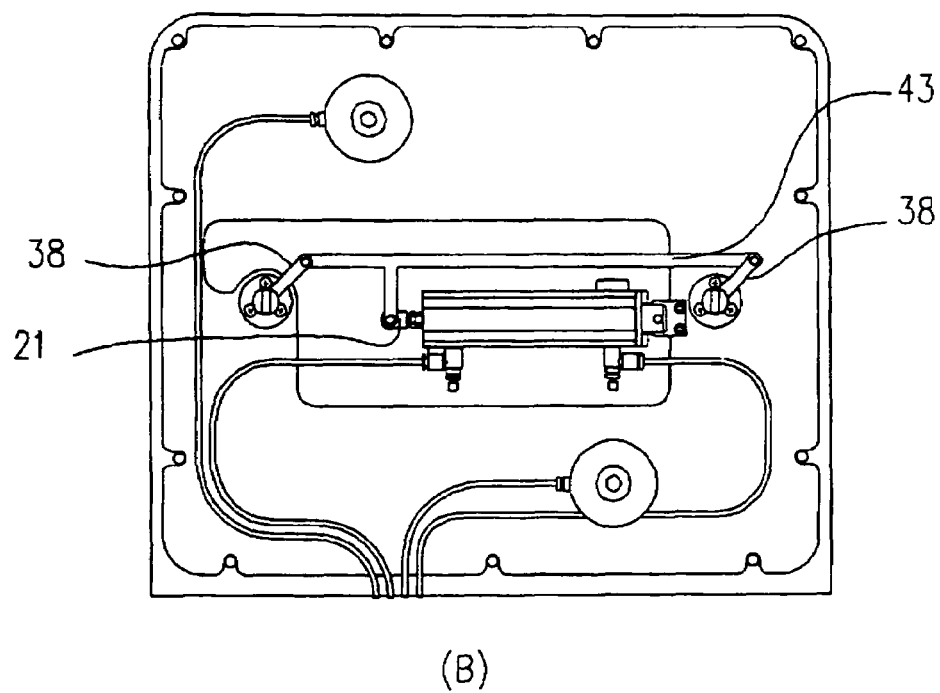

FIG. 7 (A) is a schematic elevation view of the port door of which front cover is removed, seen from stage 32. Two sets of latchkey 35 and registration pin 36 are mounted at the positions corresponding to latch holes 55 and registration holes 54 of FOUP door 51. Each latchkey 35 is connected rotatably to a connecting member 38 which is also connected to a knuckle 21 installed at the end of the piston rod of air cylinder 1. As a result, latchkey rotates with the reciprocating motion of piston rod. Cylinder 1 has a support structure 20 of clevis type at the other end, which is fixed rotatably to a support member 42 installed on the rear cover 41 of the port door. And fluid ports 5, 6 of the cylinder are connected to switching valves through air pipe 40. The valves are further connected to a compressed air source.

Holding pads 37 are disposed surrounding registration pins 36 and connected to a vacuum equipment (not shown) through piping 39 to evacuate the space between pads 37 and FOUP door 52 after the FOUP door is fitted to the port door.

In order to prevent and overcome various problems due to the shape of latchkey receptacle, it is important that latchkey receptacles be always at the 90-degree position after the latches are locked. Thus, the cylinder of the present invention which feeds the piston rod into three different positions is preferably used. In other words, the cylinder of this invention makes it possible to always place latchkey receptacles at the 90-degree position after the latch locking operation in spite of the shape of latchkey receptacles. Therefore, the collision can be prevented while the latchkeys are inserted into the latchkey receptacles for unlocking latches, and reliable latching operation is performed.

Figure 8:
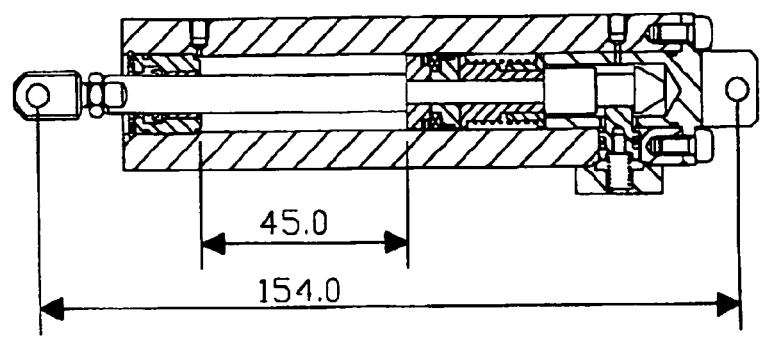
FIG. 8 is a sectional view showing the operation principle of a cylinder installed in a load port of the invention.
Figure 8:
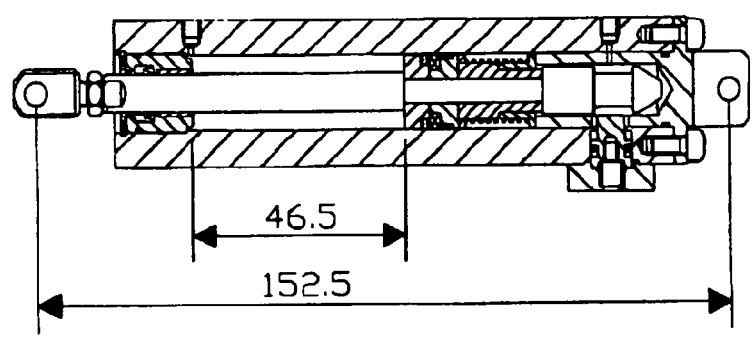
Figure 8:
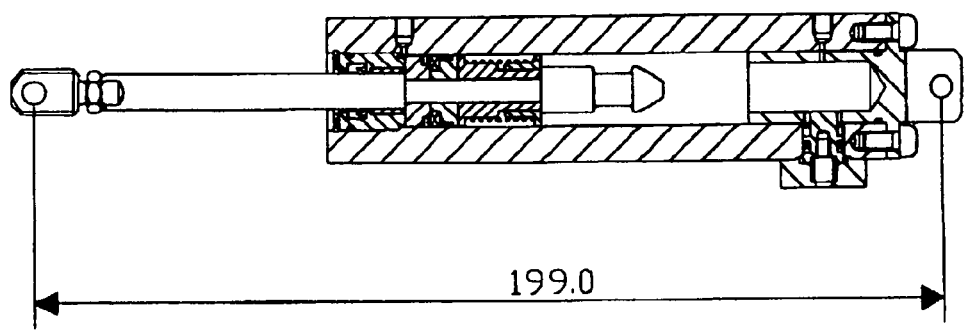
Figure 8:
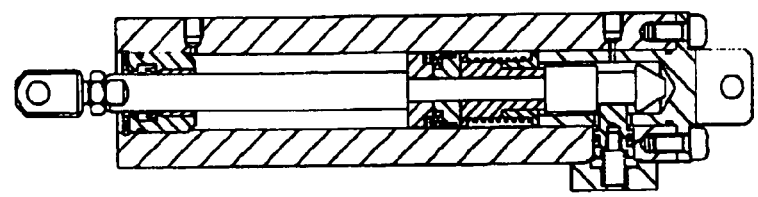
Figure 9:
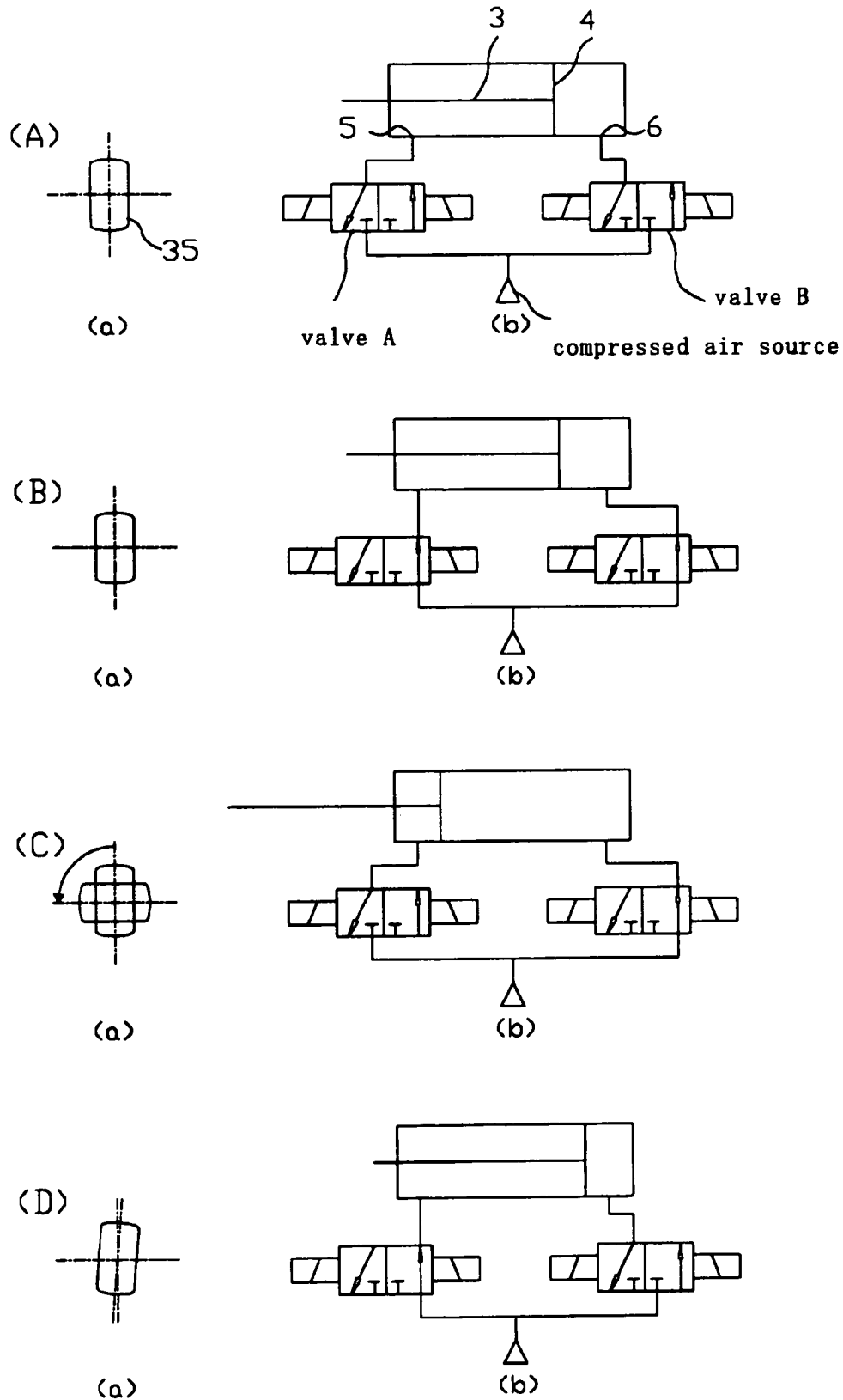
FIG. 9 is schematic diagram showing (a) latchkey position and (b) electromagnetic valve circuits for cylinders installed in a load port of the invention.

The opening and closing operation of the FOUP door is explained by the reference of FIGS. 5-10 on the case where the port door is constructed using the air cylinder shown in FIG. 1. FIG. 8 is a sectional view of cylinder showing latch operation, and FIG. 9 is a schematic diagram explaining the relationship between latchkey position and the operation of electromagnetic switching valves connected to the fluid ports of cylinder. In FIG. 8, numerical values in millimeter of piston rod position are described concertedly in each operation.

FOUP 50 is placed on stage 32 of load port 30 and then aligned with the aid of three kinematic pins 34. At this stage, FOUP box 51 and doors 52 are being fixed to each other by the latches, and therefore the inside is perfectly sealed and free from outside atmosphere. Two latchkey receptacles stay at the 90-degree position, having been turned 90 degrees from horizontal direction. Two latchkeys 35 of the port door also stay at the 90-degree position.

When stage 32 is moved towards port door 33 by the driving mechanism (not shown), registration pins 36 are inserted into registration holes 54 of FOUP door 52 to align the FOUP box and door, and then latchkeys 35 are inserted into latchkey receptacles through latch holes 55. After port door 33 is fitted to FOUP door 52, holding pad 37 is evacuated by the vacuum equipment (not shown) to fix FOUP door 52 to port door 33. At this stage, the latches are ready to be unlocked to open FOUP door 52. The relationship between the movement of the piston rod and the supply of the air to fluid ports 5,6 are explained using FIG. 8, 9. Here, two cylinders perform the identical operation.

When latchkeys 35 are to be inserted into latchkey receptacles, two cylinders are at the state shown in FIG. 8 (A), where valves A, B connected to fluid ports 5,6 are switched to the atmospheric pressure as shown in FIG. 9 (A). The piston rod 3 which is pushed leftwards by the spring stays at the position where stop pin 11 is in contact with the right end of hollow 9. The latchkeys are at the 90-degree position.

The valve A at first and the valve B immediately thereafter are switched to the high pressure (FIG. 9(B)), causing piston 4 to move in the right direction by a small amount and push stop pin 11 back against the force of spring 12 since the both side of piston 4 are at high pressure. Thus, stop pin is disengaged from hollow 9, as shown in FIG. 8 (B).

At this stage, the valve A is switched to the atmospheric pressure (FIG. 9 (C)). The leftward force applied to piston 4 pushes piston rod 3 out until piston 4 comes in contact with cylinder cover 7. Correspondingly, latchkeys 35 rotate to the 0-degree position. Latchkey receptacles also rotate together with latchkeys 35 to unlock the latches of the FOUP door (FIG. 8 (C)).

Then, port door 33 is retracted backwards and downwards from the opening by the driving mechanism (not shown) so that a robot can transfer substrates. A substrate in the FOUP is transferred to a substrate processing tool to be processed and is transferred back to the FOUP after a prescribed processing.

After all the substrates have been processed, the operation to fix FOUP door 52 to FOUP box 51 is carried out. The port door 33 is moved upwards and then forwards to be inserted inside the opening by the drive mechanism until FOUP door 52 comes in contact with FOUP box 51. Then, valves A and B are switched to the high pressure and the atmospheric pressure, respectively (FIG. 9 (D)). Piston rod 3 moves rightwards, and stop pin 11 engages with hollow 9. The rod further advances beyond the position where the stop pin 11 contacts the right end of the hollow, and stops at the position where the separation L0 is zero. In correspondence to this piston rod motion, latchkeys 35 rotate beyond the 90-degree position and stop at the 90+θ degree position (FIG. 8 (D), FIG. 9 (D)), which causes latchkey receptacles to be at the 90-degree position.

Depending on the difference between the widths of latchkey receptacle W1 and latchkey W2, latchkey receptacles may not reach the 90-degree position even when latchkeys are at the 90-degree position; for example, latchkey receptacles rotate only 86 degrees in the case where W1=6 mm and W2=5 mm. If the FOUP with this configuration of latchkey receptacles is transported to another load port, the substrates inside the FOUP may be contaminated because the seal is not sufficient, or the collision may occur between latchkey receptacles and latchkeys during the unlocking operation of latches. However, these problems are avoided by using the cylinder shown in FIG. 1. That is, latchkey receptacles always stay at the 90-degree position after locking operation mentioned above by turning the latchkeys more than 90 degrees to the (90+θ)-degree position.

When the valve A of port 5 is switched to the atmospheric pressure, piston rod 3 moves in the left direction until stop pin 11 comes in contact with the right end of hollow 9 by the force of spring 15. In correspondence to this motion, latchkeys return to the 90-degree position, and therefore both latchkey receptacles and latchkeys are set at the 90-degree position. Accordingly, FOUP becomes at the state of being transported to the load port of next process tool where the unlocking operation will be made without any trouble since latchkey receptacle are at normal configuration, while the load port is at the state of coping with next FOUP.

Figure 10:
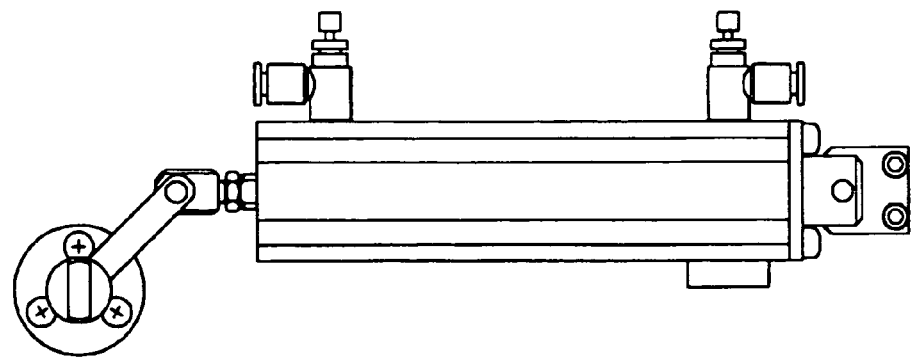
FIG. 10 is a plan view showing the movement of a cylinder with the reciprocating motion of a piston rod.
Figure 10:
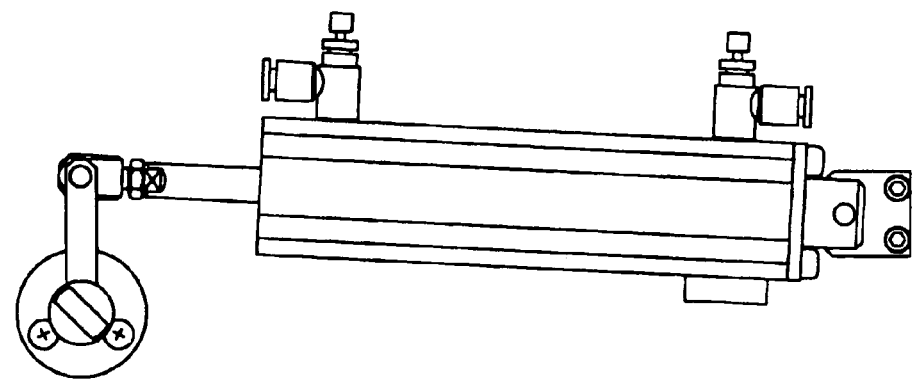
Figure 10:
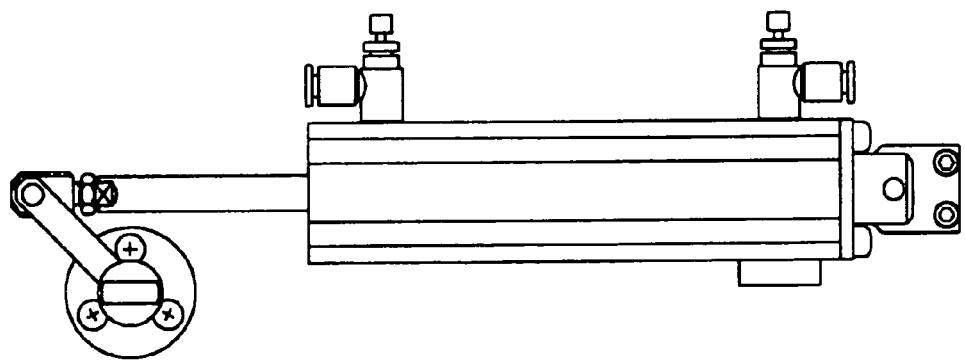

Because of the reciprocating motion of piston rod, cylinders accept the force perpendicular to its axis. Therefore, both ends 21,20 of cylinder are rotatably connected to connecting member 38 and support member 42, respectively. Thus, the cylinder will move as shown in FIG. 10 in a series of operation.

When the latches are unlocked, latchkeys are turned to the horizontal position as mentioned above. However, if the FOUP has a large width W1 of latchkey receptacles as compared with that of latchkey W2, latchkey receptacles will not rotate to the angle range of 0±1 degree, even if latchkeys are turned to 0 degree, which results in failing to unlocking the latches. Therefore, it is preferable to turn latchkeys beyond 0 degree for securely unlocking the latches; that is, latchkeys should be rotated to the (−θ) degree. The angle of (−θ) is determined by the position where piston 4 comes in contact with cylinder cover 7.

Although the load port using cylinders described in FIG. 1 has been mentioned so far, a cylinder shown in FIG. 3 is also available for the load port of this invention, in which cylinders are installed perpendicularly from the configuration of FIG. 7 (A) in the port door.

And unlike the port door of FIG. 5 which has two cylinders to drive respective latchkeys, it is also possible to realize the similar latch operation by single cylinder as shown in FIG. 7 (B). In the example of FIG. 7 (B), two connecting members 38 and knuckles 21 of cylinder are connected using a T-shaped connecting member 43. The reciprocating motion of single cylinder causes two latchkeys to rotate in phase to lock and unlock the latches.

(Production System)

A semiconductor production system of this invention will be explained by reference to FIG. 11. In a semiconductor factory, wafers 53 to be processed are stored in FOUP 50 and transported between processing tools 61. FOUP 50, which stores wafers 53 with the diameter of 300 mm is too heavy (more than 8 Kg) to carry by hand. Therefore, automating transport equipments such as OHT (Overhead Hoist Transfer) 60 will be employed for the transportation of FOUPs.

Figure 11:
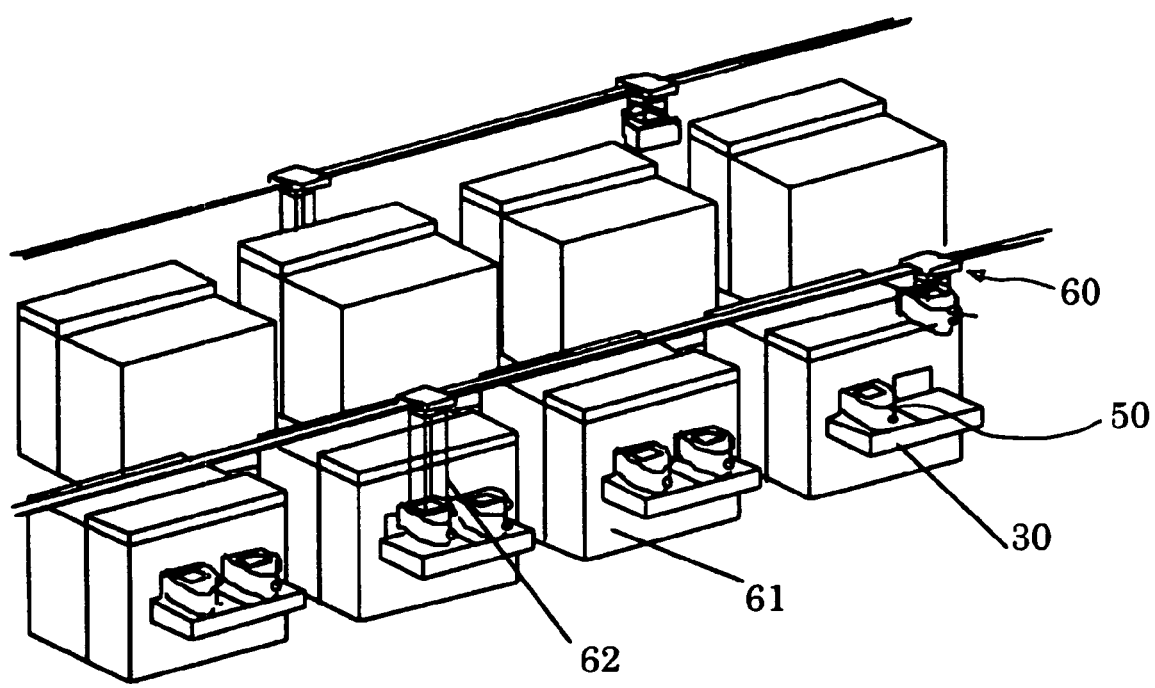
FIG. 11 is a perspective view showing a semiconductor production system of this invention.
Figure 12:
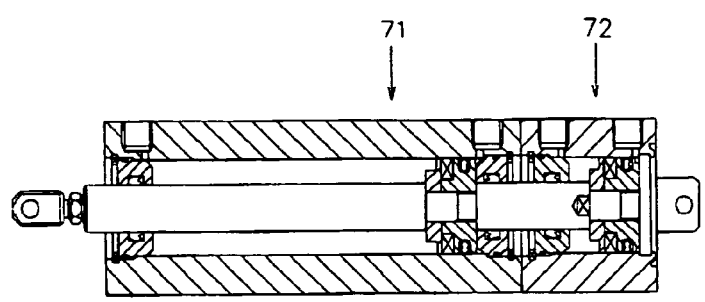
FIG. 12 is a sectional view of the cylinder enabling to feed out the piston rod into three positions, made by coupling two conventional cylinders.
Figure 12:
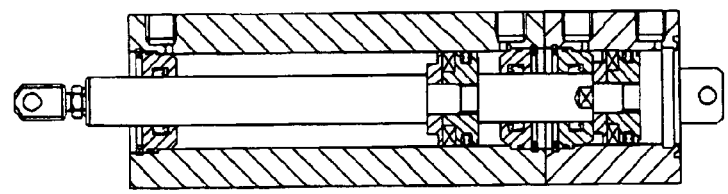
Figure 12:
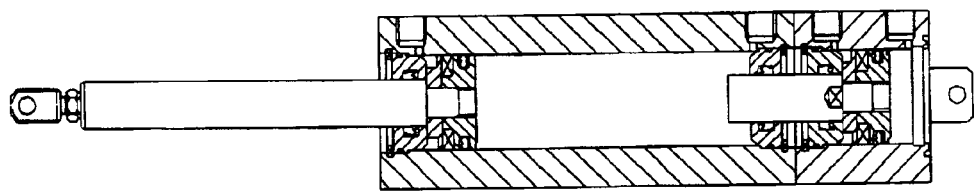
Figure 13:
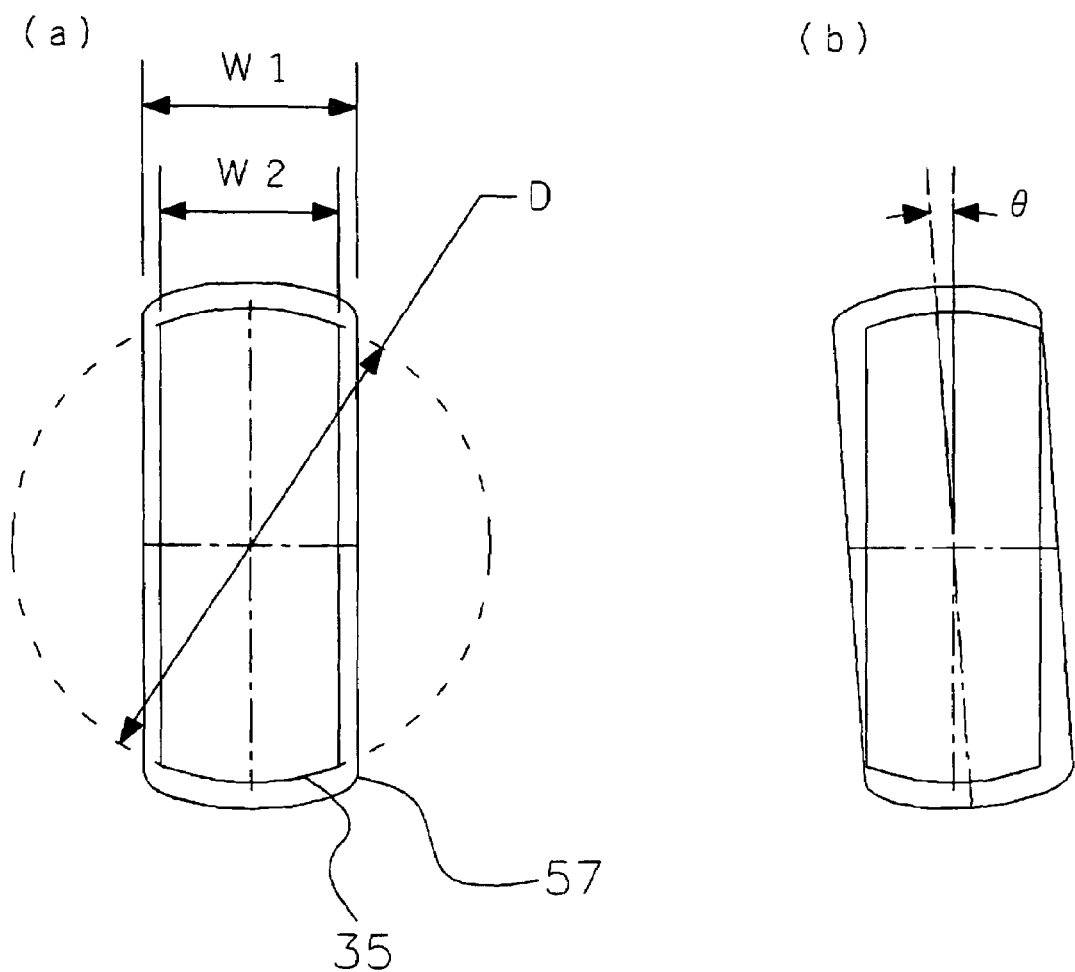
FIG. 13 is a schematic representation showing the relationship between latchkey and latchkey receptacle.

In the example of FIG. 11, OHT 60 transports FOUP 50 that stores wafers 53 to be processed from the stocker to above the processing tool 61 (for example, etching apparatus).

FOUP 50 is lowered on load port 30 of processing tool 61 with a hoist mechanism 62 and placed on the prescribed position (the transfer position). The V-grooves formed on the bottom surface of FOUP 50 couple with kinematic pins 34 of load port 30, which leads FOUP to the settlement position.

Then, hoist mechanism 62 is removed from FOUP 50 to set FOUP on load port. After FOUP 50 is moved forwards and fixed to port door 33, latchkeys 35 are turned to unlock the latches of FOUP door 52.

Then, FOUP door 52 is detached from FOUP box 51 by driving the opening and closing mechanism and is moved to the lower part of processing tool 61. A wafer 53 is taken out from the front of FOUP 50, and transferred to the processing unit (not shown) by a wafer transfer robot installed in processing tool 61. Until the semiconductor chip is completed, this opening and closing operation of FOUP door 52 will be repeated about 500 to 1000 times.

A wafer 53 is returned to FOUP 50 by the wafer transfer robot after processing. After the prescribed processing on each wafer 53 stored in FOUP 50 is made, FOUP door 52 is inserted into FOUP box 51 by driving the opening and closing mechanism. Then, latchkeys 35 are turned to the position of 90+θ degree and then returned to the 90-degree position using the cylinder of this invention, which fixes FOUP door 52 to FOUP box 51.

After that, FOUP 50 is moved back to the transfer position. According to the transport demand from the load port, an empty OHT 60 is moved to above the load port 30. FOUP 50 on the load port 30 is lifted by a robot hand (not shown) of hoist mechanism 62.

FOUP 50 is carried by OHT 60 to the stocker for temporary storage, and then carried to the next process tool (for example, ashing apparatus). The desired circuit can be formed on wafer 53 by the repetition of such procedure (substrate container transportation method).

Although the automating transportation system using OHT 60 has been explained so far, the present invention is not restricted to this system; that is, not only other automatic transportation systems such as AGV (Automated Guided Vehicle) and RGV (Rail Guided Vehicle), but the manual transportation systems using PGV (Person Guided Vehicle) are also available. It is desirable in the production method and system of this invention that load port 30 of this invention is installed to all processing tools 61. However, even a partial replacement with the load port of this invention make possible remarkably stable production as compared with conventional production method and system. Even if load ports 30 of this invention are installed to one out of 5-6 tools in the system consisting of the load ports of the invention and the prior art, the position deviation of latchkey receptacles caused at the conventional load port can be corrected accurately to the 90-degree position when FOUP is transported to the load port of this invention. Thus, the possibility of contact or collision between latchkey and latchkey receptacle during unlocking operation is reduced, which realizes more stable production system for semiconductor manufacturing.

APPLICATION TO THE INDUSTRY

As mentioned above, the present invention provides a cylinder which feed precisely a piston rod into at least three positions. And the transfer among three positions can be carried out stably. Moreover, since the cylinder of this invention is constructed with one piston rod unlike the conventional tandem type cylinder which was constructed by connecting two cylinders, the number of fluid ports is reduced to two, resulting in remarkable cost reduction and the miniaturization of cylinder.

By constructing a load port with cylinder of this invention, it becomes possible to provide the reliable load port which securely performs latching operation for opening and closing FOUP.

In addition, it becomes possible to lock and unlock the latches with single cylinder by connecting two latchkeys. Consequently, the cost of port door and load port can be remarkably reduced.

With the production system of this invention, it is possible to carry wafer between processing tools in the clean environment securely sealed and to have wafers stably processed at the each processing tool. That is, the production system makes possible the mass-production of semiconductor integrated circuits, with cost reduction related to the clean room.

The invention claimed is:

1. A cylinder in which a piston rod performs reciprocating motion with the pressure of fluid applied to a piston through two fluid ports comprising:
    a spring receiving member placed coaxially with said piston rod in a piston room of a cylinder tube so that the movement of said spring receiving member is limited by one end of said piston room;
    a first spring member to separate said spring receiving member from said piston;
    a stopper formed on said piston rod to limit said spring receiving member from moving in the opposite direction to said piston;
    a hollow formed on the periphery of said piston rod at a further position from said piston than said stopper; and
    a stop pin installed in said cylinder tube to be pressed in the direction of said hollow by a second spring member to engage with said hollow,
    said piston rod able to be fed into at least three different positions.

2. The cylinder according to claim 1, wherein said three positions of the piston rod are determined by the position where said piston comes in contact with the other end of said piston room, the position where said stop pin comes in contact with a first end of said hollow which is the most distant from said piston, and the position where the separation between said spring receiving member and said piston becomes minimum.

3. The cylinder according to claim 1, wherein said three positions of the piston rod are determined by the position where said piston comes in contact with the other end of said piston room, the position where said stop pin comes in contact with a first end of said hollow which is the most distant from said piston, and the position where said stop pin comes in contact with a second end of said hollow.

4. A load port which comprises a frame having an opening; a stage holding a substrate container having a front door to seal inside airtight using a latch and movable in the direction of said frame direction; and a port door which is inserted into said opening from the opposite side to said stage to perform latching operation of said front door, and which locks and unlocks said latch of said front door after said front door is fixed to said port door;
    said port door comprising a latchkey by which said latch is locked and unlocked when said latchkey is turned to place a latchkey receptacle disposed in said front door at the vertical and horizontal positions, respectively, and a cylinder to turn said latchkey whereby in a locking operation, when said latchkey is rotated beyond the vertical position from the horizontal position to place said latchkey receptacle at the vertical position and the latchkey is then rotated reversely to be at the vertical position, both said latchkey and said latchkey receptacle are placed at the vertical position at the end of the locking operation.

5. The load port according to claim 4, wherein said cylinder in which a piston rod performs reciprocating motion with the pressure of fluid applied to a piston through two fluid ports comprises:
- a spring receiving member placed coaxially with said piston rod in a piston room of a cylinder tube so that the movement of said spring receiving member is limited by one end of said piston room;
- a first spring member to separate said spring receiving member from said piston;
- a stopper formed on said piston rod to limit said spring receiving member from moving in the opposite direction to said piston;
- a hollow formed on the periphery of said piston rod at a further position from said piston than said stopper; and
- a stop pin installed in said cylinder tube to be pressed in the direction of said hollow by a second spring member to engage with said hollow,
- said piston rod able to fed into at least three different positions.

6. The load port according to claim 5, wherein said three positions of the piston rod are determined by the position where said piston comes in contact with the other end of said piston room, the position where said stop pin comes in contact with a first end of said hollow which is the most distant from said piston, and the position where the separation between said spring receiving member and said piston becomes minimum, and correspond to said horizontal position, said vertical position and said position of the latchkey angle which is larger than 90 degrees.

7. The load port according to claim 6, wherein said latchkey is turned beyond said horizontal position when said latchkey is turned to unlock said latch.

8. The load port according to claim 7, wherein two latchkeys are connected and simultaneously turned by single cylinder.

9. The load port according to claim 6, wherein two latchkeys are connected and simultaneously turned by single cylinder.

10. The load port according to claim 5, wherein said latchkey is turned beyond said horizontal position when said latchkey is turned to unlock said latch.

11. The load port according to claim 10, wherein two latchkeys are connected and simultaneously turned by single cylinder.

12. The load port according to claim 5, wherein two latchkeys are connected and simultaneously turned by single cylinder.

13. The load port according to claim 5, wherein said three positions of the piston rod are determined by the position where said piston comes in contact with the other end of said piston room, the position where said stop pin comes in contact with a first end of said hollow which is the most distant from said piston, and the position where said stop pin comes in contact with a second end of said hollow, and correspond to said horizontal position, said vertical position and said position of the latchkey angle which is larger than 90 degrees.

14. The load port according to claim 4, wherein said latchkey is turned beyond said horizontal position when said latchkey is turned to unlock said latch.

15. The load port according to claim 14, wherein two latchkeys are connected and simultaneously turned by single cylinder.

16. The load port according to claim 4, wherein two latchkeys are connected and simultaneously turned by single cylinder.

17. A production system comprising a load port which is composed oft a frame having an opening; a stage holding a substrate container having a front door to seal inside airtight using a latch and movable in the direction of said frame direction; and a port door which is inserted into said opening from the opposite side to said stage to perform latching operation of said front door, to lock and unlock said latch of said front door after said front door is fixed to said port door;

said port door comprising a latchkey by which said latch is locked and unlocked when said latchkey is turned to place a latchkey receptacle disposed in said front door at the vertical and horizontal positions, respectively, and a cylinder to turn said latchkey, whereby in a locking operation, when said latchkey is rotated beyond the vertical position from the horizontal position to place said latchkey receptacle at the vertical position and is then rotated reversely to the vertical position, both said latchkey and said latchkey receptacle are placed at the vertical position at the end of the locking operation.

18. The production system according to claim 17, wherein said cylinder in which a piston rod performs reciprocating motion with the pressure of fluid applied to a piston through two fluid ports comprises:
- a spring receiving member placed coaxially with said piston rod in a piston room of a cylinder tube so that the movement of said spring receiving member is limited by one end of said piston room;
- a first spring member to separate said spring receiving member from said piston;
- a stopper formed on said piston rod to limit said spring receiving member from moving in the opposite direction to said piston;
- a hollow formed on the periphery of said piston rod at a further position from said piston than said stopper; and
- a stop pin installed in said cylinder tube to be pressed in the direction of said hollow by a second spring member to engage with said hollow, said piston rod able to fed into at least three different positions.

19. The production system according to claim 18, wherein said three positions of the piston rod are determined by the position where said piston comes in contact with the other end of said piston room, the position where said stop pin comes in contact with a first end of said hollow which is the most distant from said piston, and the position where the separation between said spring receiving member and said piston becomes minimum, and correspond to said horizontal position, said vertical position and said position of the latchkey angle which is larger than 90 degrees.

20. The production system according to claim 18, wherein said three positions of the piston rod are determined by the position where said piston comes in contact with the other end of said piston room, the position where said stop pin comes in contact with a first end of said hollow which is the most distant from said piston, and the position where said stop pin comes in contact with a second end of said hollow, and correspond to said horizontal position, said vertical position and said position of the latchkey angle which is larger than 90 degrees.

21. The production system according to claim 17, wherein said latchkey is turned beyond said horizontal position when said latchkey is turned to unlock said latch.

22. The production system according to claim 17, wherein two latchkeys are connected and simultaneously turned by single cylinder.

* * * * *